United States Patent
Ye et al.

(10) Patent No.: US 9,633,861 B2
(45) Date of Patent: Apr. 25, 2017

(54) CU/BARRIER INTERFACE ENHANCEMENT

(71) Applicant: Applied Materials, Inc., Santa Clara, CA (US)

(72) Inventors: Weifeng Ye, San Jose, CA (US); Mei-yee Shek, Palo Alto, CA (US); Mihaela Balseanu, Sunnyvale, CA (US); Xiaojun Zhang, Santa Clara, CA (US); Xiaolan Ba, San Jose, CA (US); Yu Jin, Santa Clara, CA (US); Li-Qun Xia, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 313 days.

(21) Appl. No.: 14/180,054

(22) Filed: Feb. 13, 2014

(65) Prior Publication Data

US 2014/0273438 A1    Sep. 18, 2014

Related U.S. Application Data

(60) Provisional application No. 61/777,548, filed on Mar. 12, 2013.

(51) Int. Cl.
*H01L 21/285* (2006.01)
*H01L 21/768* (2006.01)

(52) U.S. Cl.
CPC .. *H01L 21/28562* (2013.01); *H01L 21/76849* (2013.01); *H01L 21/76862* (2013.01); *H01L 21/76864* (2013.01); *H01L 21/76883* (2013.01); *H01L 21/76834* (2013.01)

(58) Field of Classification Search
None
See application file for complete search history.

(56) References Cited

U.S. PATENT DOCUMENTS

| 2006/0046479 A1* | 3/2006 | Rajagopalan | C23C 16/325 438/683 |
| 2009/0029036 A1* | 1/2009 | Dussarrat | C07F 17/00 427/96.1 |
| 2014/0183738 A1* | 7/2014 | Jezewski | H01L 23/485 257/751 |

* cited by examiner

*Primary Examiner* — Marvin Payen
(74) *Attorney, Agent, or Firm* — Patterson & Sheridan, LLP

(57) ABSTRACT

Embodiments of the present invention provide processes to selectively form a metal layer on a conductive surface, followed by flowing a silicon based compound over the metal layer to form a metal silicide layer. In one embodiment, a substrate having a conductive surface and a dielectric surface is provided. A metal layer is then deposited on the conductive surface. A metal silicide layer is formed as a result of flowing a silicon based compound over the metal layer. A dielectric is formed over the metal silicide layer.

8 Claims, 3 Drawing Sheets

CU/BARRIER INTERFACE ENHANCEMENT

CROSS-REFERENCE TO RELATED APPLICATIONS

This application claims benefit of U.S. Provisional Patent Application Ser. No. 61/777,548 (APPM 17982USL), filed Mar. 12, 2013, which is herein incorporated by reference.

BACKGROUND

Field

Embodiments described herein relate to the fabrication of integrated circuits. More particularly, embodiments described herein relate to a method and apparatus for processing a substrate that improve electronmigration (EM) between a conductive material and a dielectric material.

Description of the Related Art

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), the materials used to fabricate such components contribute to the electrical performance of such components. For example, low resistivity metal interconnects (e.g., aluminum and copper) provide conductive paths between the components on integrated circuits.

One method for forming vertical and horizontal interconnects is by a damascene or dual damascene method. In the damascene method, one or more dielectric materials, such as the low k dielectric materials, are deposited and pattern etched to form the vertical interconnects, i.e. vias, and horizontal interconnects, i.e., lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, are then removed and a planarized surface is formed by chemical mechanical polish (CMP). A dielectric layer, such as an insulation layer or barrier layer is formed over the copper feature for subsequent processing, such as forming a second layer of damascene structures.

To prevent the conductive material diffusion across the boundary regions, barrier and capping layers may be deposited over the conductive material to contain the conductive material. One interface that such diffusion may occur is between the conductive material and the dielectric barrier layer formed over the conductive material. Therefore, an improved barrier layer is needed to improve EM reliability.

SUMMARY

Embodiments of the present invention provide processes to selectively form a metal layer on a conductive surface, followed by flowing a silicon based compound over the metal layer to form a metal silicide layer. In one embodiment, a substrate having a conductive surface and a dielectric surface is provided. A metal layer is then deposited on the conductive surface. A metal silicide layer is formed as a result of flowing a silicon based compound over the metal layer. A dielectric is formed over the metal silicide layer.

In one embodiment, a method for processing a substrate is disclosed. The method includes providing a substrate having a conductive surface and a dielectric surface, depositing a cobalt layer over the conductive surface; flowing a silicon based compound over the cobalt layer to form a cobalt silicide layer, and depositing a dielectric barrier layer over the cobalt silicide layer.

In another embodiment, a method for processing a substrate is disclosed. The method includes providing a substrate having a copper surface and a dielectric surface, depositing a metal layer over the copper surface; flowing a silicon based compound over the metal layer to form a metal silicide layer, and depositing a dielectric barrier layer over the metal silicide layer.

In another embodiment, a method for processing a substrate is disclosed. The method includes providing a substrate having a copper surface and a dielectric surface, depositing a cobalt layer over the copper surface; flowing trisilyamine (TSA) or silane ($SiH_4$) over the cobalt layer to form a cobalt silicide layer, and depositing a silicon carbon nitride (SiCN) layer over the cobalt silicide layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention provide processes to selectively form a metal layer on a conductive surface, followed by flowing a silicon based compound over the metal layer to form a metal silicide layer. In one embodiment, a substrate having a conductive surface and a dielectric surface is provided. A metal layer is then deposited on the conductive surface. A metal silicide layer is formed as a result of flowing a silicon based compound over the metal layer. A dielectric is formed over the metal silicide layer.

Figure 1:
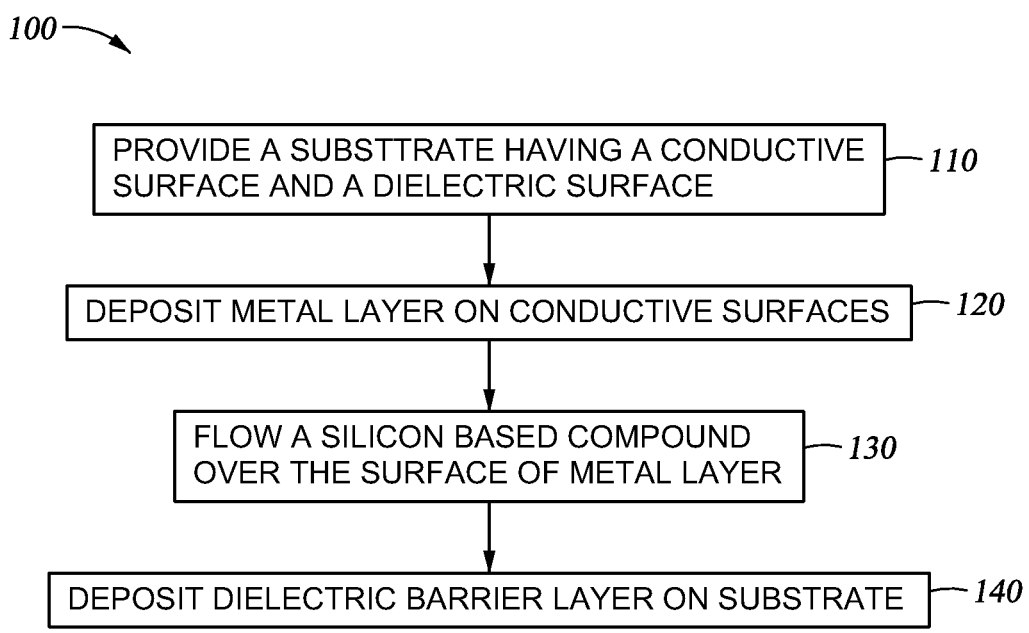
FIG. 1 depicts a flow diagram illustrating a method according to an embodiment described herein.
Figure 2:
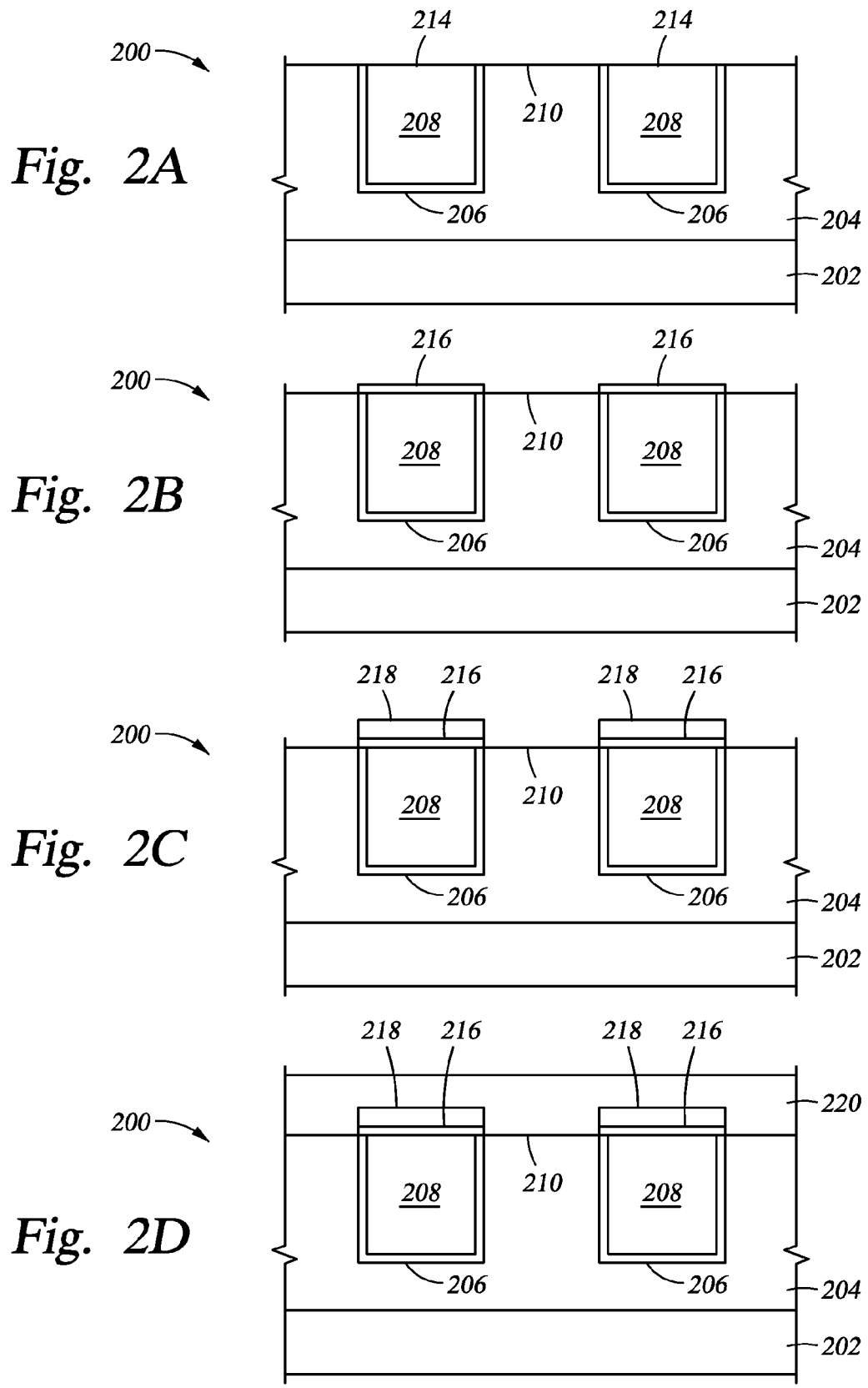
FIGS. 2A-2D depict schematic cross sectional views of a substrate at different process steps according to an embodiment described herein.

FIG. 1 is a flow diagram of a method 100 according to an embodiment of the invention. FIGS. 2A-2D illustrate schematic cross sectional views of a substrate during different stages of the method 100 of FIG. 1. The method 100 starts at process 110 by providing a substrate 200 as shown in FIG. 2A. The substrate 200 has a dielectric layer 204 disposed over an underlayer 202. Conductive contacts 208 are disposed within the dielectric layer 204 and are separated from the dielectric layer 204 by barrier layers 206. The dielectric layer 204 contains a dielectric material, such as a low-k dielectric material. In one example, the dielectric layer 204 contains a low-k dielectric material, such as a silicon carbide oxide material or a carbon doped silicon oxide material, for example, BLACK DIAMOND® II low-k dielectric material, available from Applied Materials, Inc., located in Santa Clara, Calif.

The barrier layer 206 may be conformally deposited into the aperture within the dielectric layer 204. The barrier layer 206 may be formed or deposited by a physical vapor deposition (PVD) process, an atomic layer deposition (ALD) process, or a CVD process, and may have a thickness within a range from about 5 Å to about 50 Å, such as from about 10 Å to about 30 Å. The barrier layer 206 may contain titanium, titanium nitride, tantalum, tantalum nitride, tungsten, tungsten nitride, silicides thereof, derivatives thereof, or combinations thereof. In some embodiments, the barrier layer 206 may contain a tantalum/tantalum nitride bilayer or titanium/titanium nitride bilayer. In one example, the barrier layer 206 contains tantalum nitride and metallic tantalum layers deposited by PVD processes. The conductive contacts 208 may be a metal, such as copper.

As shown in FIG. 2A, the substrate 200 has a conductive surface 214 and a dielectric surface 210. The substrate 200 may be exposed to a treatment to remove metal oxide and post-CMP residues or contaminants formed on the conductive surface. In one embodiment, the substrate 200 is exposed to a thermal treatment. The substrate 200 may be positioned within a processing chamber, exposed to a reducing agent, and heated to a temperature within a range from about 200° C. to about 800° C., such as from about 250° C. to about 600° C. In one embodiment, the temperature ranges from about 300° C. to about 500° C. The substrate 200 may be heated for a time period within a range from about 15 seconds to about 5 minutes, such as from about 30 seconds to about 2 minutes. For example, the substrate 200 may be heated to about 350° C. in a processing chamber containing a hydrogen atmosphere for about 30 seconds.

In another embodiment, the substrate 200 is exposed to a plasma pre-treatment process to remove metal oxide and post-CMP residues or contaminants from the conductive contacts 208 while forming the conductive surfaces 214. The substrate 200 may be positioned within a processing chamber, exposed to a reducing agent, and heated to a temperature within a range from about 100° C. to about 500° C., such as from about 125° C. to about 450° C. In one embodiment, the temperature ranges from about 150° C. to about 400° C., such as about 250° C. or about 350° C. The processing chamber may produce an in-situ plasma or be equipped with a remote plasma source (RPS). In one embodiment, the substrate 200 may be exposed to the plasma (e.g., in situ or remotely) for a time period within a range from about 2 seconds to about 60 seconds, such as from about 3 seconds to about 40 seconds. In one embodiment, the time period ranges from about 5 seconds to about 20 seconds, such as about 10 seconds. The plasma may be produced at a power within the range from about 200 watts to about 1,000 watts, such as from about 400 watts to about 800 watts. In one example, the substrate 200 may be exposed to hydrogen gas while a plasma is generated at 400 watts for about 10 seconds at about 5 Torr. In another example, the substrate 200 may be exposed to ammonia gas while a plasma is generated at 550 watts for about 5 seconds at about 3 Torr. In another example, the substrate 200 may be exposed to a hydrogen and ammonia gaseous mixture while a plasma is generated at 400 watts for about 15 seconds at about 5 Torr. In another example, the substrate 200 may be exposed to a hydrogen gas while a remote plasma is generated at 550 watts for about 20 s at about 0.1 Torr.

At process 120, a metal layer 216 may be selectively deposited on the conductive surfaces 214 while leaving bare the exposed dielectric surfaces 210, as illustrated in FIG. 2B. Initially, the metal layer 216 may be a continuous layer or a discontinuous layer across the conductive surfaces 214, but is typically a continuous layer after multiple deposition cycles. In one embodiment, the metal layer 216 is a cobalt layer and is deposited by thermal decomposition of a cobalt containing precursor carried by an inert gas during process 120. A reducing gas may be co-flowed or alternately pulsed into the processing chamber along with the cobalt precursor. The substrate 200 may be heated to a temperature within a range from about 50° C. to about 600° C., such as from about 100° C. to about 500° C. In one embodiment, the temperature ranges from about 200° C. to about 400° C. Alternatively, the cobalt layer may be deposited by exposing the substrate 200 to a cobalt containing precursor gas in an ALD or CVD process, either of which may be plasma enhanced.

Suitable cobalt precursors for forming the cobalt layer by CVD or ALD processes described herein include cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. In some embodiments, cobalt carbonyl compounds or complexes may be utilized as cobalt precursors. Cobalt carbonyl compounds or complexes have the general chemical formula $(CO)_xCo_yL_z$, where X may be 1, 2, 3, 4, 5, 6, 7, 8, 9, 10, 11, or 12, Y may be 1, 2, 3, 4, or 5, and Z may be 1, 2, 3, 4, 5, 6, 7, or 8. The group L is absent, one ligand or multiple ligands, that may be the same ligand or different ligands, and include cyclopentadienyl, alkylcyclopentadienyl (e.g., methylcyclopentadienyl or pentamethylcyclopentadienyl), pentadienyl, alkylpentadienyl, cyclobutadienyl, butadienyl, ethylene, allyl (or propylene), alkenes, dialkenes, alkynes, acetylene, bytylacetylene, nitrosyl, ammonia, derivatives thereof, complexes thereof, plasma thereof, or combinations thereof. Some exemplary cobalt carbonyl complexes include cyclopentadienyl cobalt bis(carbonyl) ($CpCo(CO)_2$), tricarbonyl allyl cobalt ($(CO)_3Co(CH_2CH=CH_2)$), dicobalt hexacarbonyl bytylacetylene (CCTBA, $(CO)_6Co_2(HC\equiv C^tBu)$), dicobalt hexacarbonyl methylbytylacetylene ($(CO)_6Co_2(MeC\equiv C^tBu)$), dicobalt hexacarbonyl phenylacetylene ($(CO)_6Co_2(HC\equiv CPh)$), hexacarbonyl methylphenylacetylene ($(CO)_6Co_2(MeC\equiv CPh)$), dicobalt hexacarbonyl methylacetylene ($(CO)_6Co_2(HC\equiv CMe)$), dicobalt hexacarbonyl dimethylacetylene ($(CO)_6Co_2(MeC\equiv CMe)$), derivatives thereof, complexes thereof, plasma thereof, or combinations thereof.

In another embodiment, cobalt amidinates or cobalt amido complexes may be utilized as cobalt precursors. Cobalt amido complexes have the general chemical formula $(RR'N)_xCo$, where X may be 1, 2, or 3, and R and R' are independently hydrogen, methyl, ethyl, propyl, butyl, alkyl, silyl, alkylsilyl, derivatives thereof, or combinations thereof. Some exemplary cobalt amido complexes include bis(di (butyldimethylsilyl)amido) cobalt $(((BuMe_2Si)_2N)_2Co)$, bis (di(ethyldimethylsilyl)amido) cobalt $(((EtMe_2Si)_2N)_2Co)$, bis(di(propyldimethylsilyl)amido) cobalt $(((PrMe_2Si)_2N)_2Co)$, bis(di(trimethylsilyl)amido) cobalt $(((Me_3Si)_2N)_2Co)$, tris(di(trimethylsilyl)amido) cobalt $(((Me_3Si)_2N)_3Co)$, derivatives thereof, complexes thereof, plasma thereof, or combinations thereof.

Some exemplary cobalt precursors include methylcyclopentadienyl cobalt bis(carbonyl) $(MeCpCo(CO)_2)$, ethylcyclopentadienyl cobalt bis(carbonyl) $(EtCpCo(CO)_2)$, pentamethylcyclopentadienyl cobalt bis(carbonyl) $(Me_5CpCo(CO)_2)$, dicobalt octa(carbonyl) $(Co_2(CO)_8)$, nitrosyl cobalt tris(carbonyl) $((ON)Co(CO)_3)$, bis(cyclopentadienyl) cobalt, (cyclopentadienyl) cobalt (cyclohexadienyl), cyclopentadienyl cobalt (1,3-hexadienyl), (cyclobutadienyl) cobalt (cyclopentadienyl), bis(methylcyclopentadienyl) cobalt, (cyclopentadienyl) cobalt (5-methylcyclopentadienyl), bis(ethylene) cobalt (pentamethylcyclopentadienyl), cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl, acetylene dicobalt pentacarbonyl triethylphosphine, derivatives thereof, complexes thereof, plasma thereof, or combinations thereof.

As a result of the deposition process, contaminants may collect on the metal layer 216 and the dielectric surface 210. Contaminants may include by-products from the deposition process, such as carbon, organic residue, precursor residue, and other undesirable materials. Thus, a post-treatment process may be performed to re-generate the metal surface. The post-treatment process removes or reduces the amount of contaminants from substrate 200 while further densifying the metal layer 216. The post-treatment process may expose the substrate 200 and the metal layer 216 to a reducing agent during the process. Reducing agent that are useful during the post-treatment process include hydrogen (e.g., $H_2$ or atomic-H), ammonia ($NH_3$), a hydrogen and ammonia mixture ($H_2/NH_3$), nitrogen (e.g., $N_2$ or atomic-N), hydrazine ($N_2H_4$), derivatives thereof, plasmas thereof, or combinations thereof. The metal layer 216 may be exposed to a plasma during the post-treatment process for a time period within a range from about 2 seconds to about 60 seconds, such as from about 3 seconds to about 30 seconds. In one embodiment, the time period ranges from about 5 seconds to about 15 seconds.

In one example, the metal layer 216 is exposed to a hydrogen plasma, formed by activating hydrogen gas in-situ or remotely. In another example, the metal layer 216 is exposed to an ammonia plasma, formed by activating ammonia gas in-situ or remotely. In another example, the metal layer 216 is exposed to a hydrogen/ammonia plasma, formed by activating a mixture of hydrogen gas and ammonia gas in-situ or remotely.

A plasma may be generated external from the processing chamber, such as by a remote plasma source (RPS) system, or the plasma may be generated in-situ using a plasma capable deposition chamber, such as a PECVD chamber during a plasma treatment process. The plasma may be generated from a microwave (MW) frequency generator or a radio frequency (RF) generator. In one example, an in-situ plasma is generated by a RF generator. The processing chamber may be pressurized during the plasma treatment process at a pressure within a range from about 0.1 Torr to about 80 Torr, such as from about 0.5 Torr to about 10 Torr. In one embodiment, the pressure ranges from about 1 Torr to about 5 Torr. Also, the chamber or the substrate 200 may be heated to a temperature of less than about 500° C., such as within a range from about 100° C. to about 450° C. In one embodiment, the temperature ranges from about 150° C. to about 400° C., for example, about 300° C.

At process 130, a silicon based compound is flowed over the surface of the metal layer 216. The silicon based compound reacts with the metal layer 216 to form a metal silicide layer 218 over the metal layer 216, as shown in FIG. 2C. In one embodiment, the conductive material 208 is copper, the metal layer 216 is a cobalt layer, and the metal silicide layer 218 is a cobalt silicide layer. The cobalt and cobalt silicide layers provide a stronger copper-cobalt and cobalt-silicon bonds to strengthen the interfaces, thus improving EM reliability.

In one embodiment, the metal silicide layer 218 is formed using a thermal process, e.g., without the presence of a plasma. In this particular embodiment, the metal silicide layer 218 may be formed mainly on the exposed surface of the metal layer 216. The thermal energy causes the silicon atoms from the silicon based compound to mainly be absorbed on the metal atoms of the metal layer 216, forming the metal silicide layer 218 on the exposed surface of the metal layer 216. Alternatively, in the embodiment wherein the silicon based compound supplied to the processing chamber is performed by a plasma process.

The silicon based compound may be a carbon-free silicon compound, including silane ($SiH_4$), disilane ($Si_2H_6$), trisilane ($Si_3H_8$), trisilylamine (($SiH_3)_3N$ or TSA), derivatives thereof, and combinations thereof. The silicon based compound may also be a carbon-containing silicon compound, including organosilicon compounds described herein, for example, methylsilane ($CH_3SiH_3$), trimethylsilane (TMS), derivatives thereof, and combinations thereof. The silicon based compound may react with the metal layer 216 by thermally and/or alternatively, plasma enhanced process. Dopants, such as oxygen containing and nitrogen containing dopants, for example, $NH_3$, may be used with the silicon based compounds as described herein. Additionally, an inert gas, such as nitrogen or a noble gas including helium and argon, may be used during the silicide process, and may be used as a carrier gas for the thermal process or as an additional plasma species for the plasma enhanced silicide formation process. The silicon based compound may further include a dopant, such as the reducing compound described herein, to form a nitrosilicide. In such an embodiment, the reducing compound may be delivered as described herein.

In one embodiment, a silicide process with the silicon based compounds described herein includes providing silicon based compounds to a processing chamber at a flow rate between about 10 sccm and about 1,000 sccm, such as between about 100 sccm and about 800 sccm. Optionally, an inert gas, such as helium, argon, or nitrogen, may also by supplied to a processing chamber at a flow rate between about 100 sccm and about 20,000 sccm, such as between about 2,000 sccm and about 19,000 sccm. The process chamber pressure may be maintained between about 0.5 Torr and about 12 Torr, such as between about 2 Torr and about 9 Torr. The heater temperature may be maintained between about 100° C. and about 500° C., such as between about 250° C. and about 450° C. The gas distributor or "showerhead" may be positioned between about 200 mils and about 1000 mils, such as between 200 mils and 600 mils from the surface of the substrate 200.

In another embodiment, the silicon based compound is provided to the processing chamber at a flow rate between about 40 sccm and about 5,000 sccm, such as between about 1,000 sccm and about 2,000 sccm. Optionally, an inert gas, such as helium, argon or nitrogen, may also be supplied to a processing chamber at a flow rate between about 100 sccm and about 20,000 sccm, such as between about 15,000 sccm and about 19,000 sccm. The process chamber pressure may be maintained between about 1 Torr and about 8 Torr, such as between about 3 Torr and about 5 Torr. The heater temperature may be maintained between about 100° C. and about 500° C., such as between about 250° C. and about 450° C. In one embodiment, the temperature is less than 300° C. A spacing between a gas distributor, or "showerhead" is between about 200 mils and about 1,000 mils, such as between 300 mils and 500 mils from the surface of the substrate 200. The metal silicide layer 218 formation process may be performed between about 1 second and about 20 seconds, such as between about 1 second and about 10 seconds.

The metal silicide layer 218 formation process may be further enhanced by generating a plasma. The plasma may be generated by applying a power density ranging between about 0.01 W/cm$^2$ and about 6.4 W/cm$^2$, which is a RF power level of between about 10 W and about 2,000 W, such as between about 100 W and about 400 W at a high frequency between 13 MHz and 14 MHz, such as 13.56 MHz. Alternatively, all plasma generation may be performed remotely, with the generated radicals introduced into the processing chamber for plasma treatment of a deposited material or deposition of a material layer. The plasma may be generated between about 1 second and about 60 seconds, such as between about 1 second and about 5 seconds for formation of the metal silicide layer 218.

One example of the silicide process includes providing TSA to a processing chamber at a flow rate of about 350 sccm, providing nitrogen to a processing chamber at a flow rate of about 5,000 sccm, maintaining a chamber pressure at about 4 Torr, maintaining a heater temperature of about 350° C., positioning a gas distributor, or "showerhead", at about 350 mils from the surface of the substrate 200, for about 10 seconds.

Another example of the silicide process includes providing $SiH_4$ to a processing chamber at a flow rate of about 125 sccm, providing nitrogen to a processing chamber at a flow rate of about 18,000 sccm, maintaining a chamber pressure at about 4.2 Torr, maintaining a heater temperature of about 275° C., providing a spacing between a gas distributor, or showerhead of about 350 mils from the surface of the substrate 200, for about 4 seconds.

At process 140, a dielectric barrier layer 220 may be deposited over the metal silicide layer 218 and on substrate 200, as shown in FIG. 2D. Dielectric barrier layer 220 having a low dielectric constant may be deposited on substrate 200, across the dielectric surface 210, and over the metal silicide layer 218. The dielectric barrier layer 220 may contain a low-k dielectric material, such as silicon carbide, silicon nitride, silicon oxide, silicon oxynitride, silicon carbide oxide or carbon doped silicon oxide material, derivatives thereof, or combinations thereof. In one example, BLOK® low-k dielectric material, available from Applied Materials, Inc., located in Santa Clara, Calif., may be utilized as a low-k dielectric material for dielectric barrier layer 220.

Figure 3:
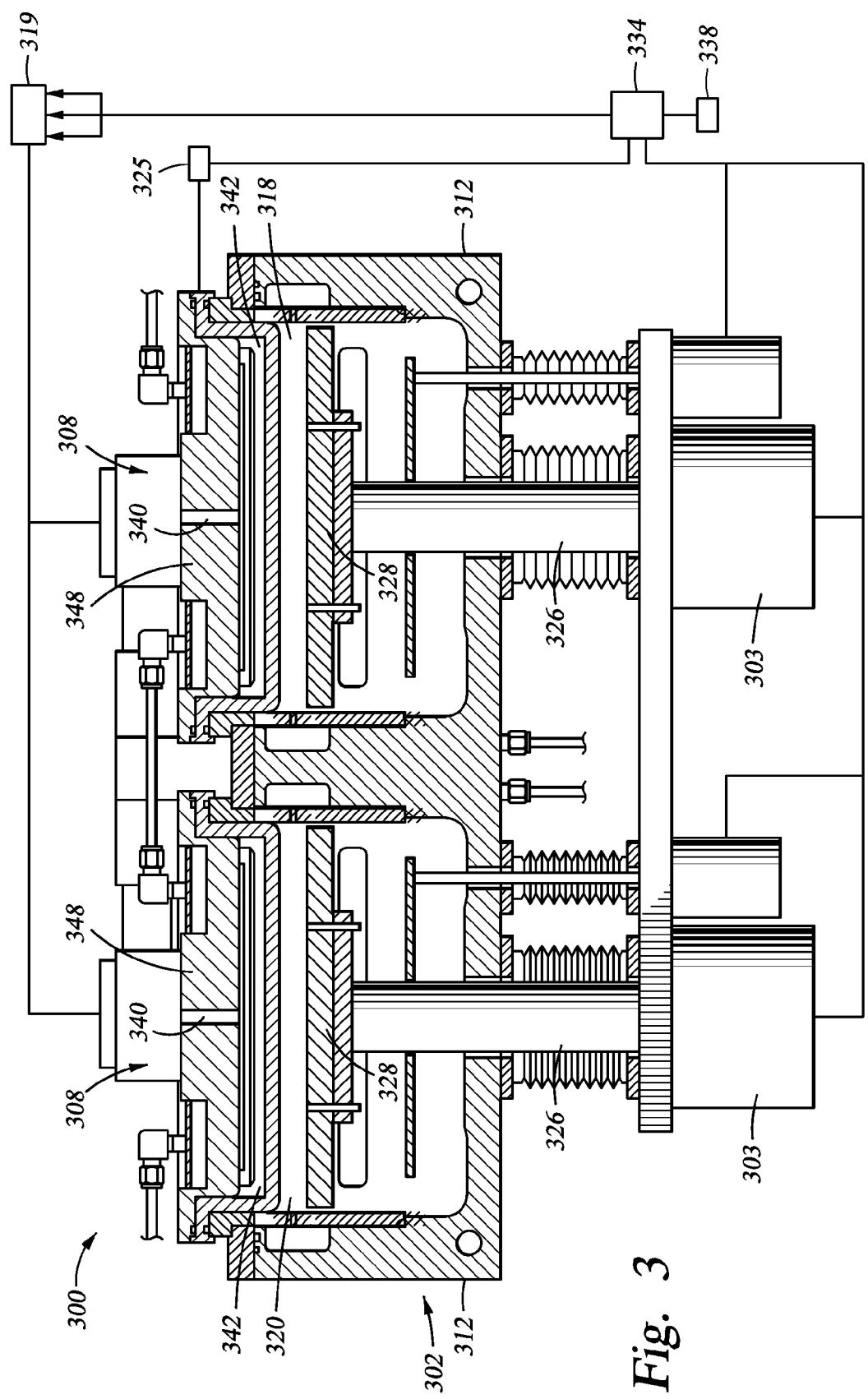
FIG. 3 is a cross sectional schematic diagram of a chemical vapor deposition (CVD) chamber that may be used to perform the methods described herein.

FIG. 3 is a cross sectional schematic diagram of a CVD chamber 300 that may be used for practicing embodiments of the invention. An example of such a chamber is a dual or twin chamber on a PRODUCER® system, available from Applied Materials, Inc. of Santa Clara, Calif. The twin chamber has two isolated processing regions (for processing two substrates, one substrate per processing region) such that the flow rates experienced in each region are approximately one half of the flow rates into the whole chamber. The flow rates described in the examples below and throughout the specification are the flow rates per 300 mm substrate. A chamber having two isolated processing regions is further described in U.S. Pat. No. 5,855,681, which is incorporated by reference herein. Another example of a chamber that may be used is a DxZ® chamber on a CENTURA® system, both of which are available from Applied Materials, Inc.

The CVD chamber 300 has a chamber body 302 that defines separate processing regions 318, 320. Each processing region 318, 320 has a pedestal 328 for supporting a substrate (not shown) within the CVD chamber 300. Each pedestal 328 typically includes a heating element (not shown). In one embodiment, each pedestal 328 is movably disposed in one of the processing regions 318, 320 by a stem 326 which extends through the bottom of the chamber body 302 where it is connected to a drive system 303.

Each of the processing regions 318, 320 may include a gas distribution assembly 308 disposed through a chamber lid to deliver gases into the processing regions 318, 320. The gas distribution assembly 308 of each processing region normally includes a gas inlet passage 340 which delivers gas from a gas flow controller 319 into a gas distribution manifold 342, which is also known as a showerhead assembly. Gas flow controller 319 is typically used to control and regulate the flow rates of different process gases into the chamber. Other flow control components may include a liquid flow injection valve and liquid flow controller (not shown) if liquid precursors are used. The gas distribution manifold 342 comprises an annular base plate 348, a face plate 346, and a blocker plate 344 between the base plate 348 and the face plate 346. The gas distribution manifold 342 includes a plurality of nozzles (not shown) through which gaseous mixtures are injected during processing. An RF (radio frequency) source 325 provides a bias potential to the gas distribution manifold 342 to facilitate generation of a plasma between the showerhead assembly 342 and the pedestal 328. During a plasma-enhanced chemical vapor deposition (PECVD) process, the pedestal 328 may serve as a cathode for generating the RF bias within the chamber body 302. The cathode is electrically coupled to an electrode power supply to generate a capacitive electric field in the chamber 300. Typically an RF voltage is applied to the cathode while the chamber body 302 is electrically grounded. Power applied to the pedestal 328 creates a substrate bias in the form of a negative voltage on the upper surface of the substrate. This negative voltage is used to attract ions from the plasma formed in the chamber 300 to the upper surface of the substrate.

During processing, process gases are uniformly distributed radially across the substrate surface. The plasma is formed from one or more process gases or a gas mixture by applying RF energy from the RF power supply 325 to the gas distribution manifold 342, which acts as a powered electrode. Film deposition takes place when the substrate is exposed to the plasma and the reactive gases provided therein. The chamber walls 312 are typically grounded. The RF power supply 325 can supply either a single or mixed-frequency RF signal to the gas distribution manifold 342 to enhance the decomposition of any gases introduced into the processing regions 318, 320.

A system controller 334 controls the functions of various components such as the RF power supply 325, the drive system 303, the lift mechanism, the gas flow controller 319, and other associated chamber and/or processing functions. The system controller 334 executes system control software stored in a memory 338, which in the preferred embodiment is a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes, and other plasma processing chambers may also be employed for practicing embodiments described herein.

In summary, methods for forming an improved interface between the conductive material and the dielectric barrier layer are disclosed. A metal layer is selectively deposited over the conductive surface. A silicon based compound is flowed over the surface of the metal layer to form a metal silicide layer over the metal layer. The metal silicide and the metal layers may strengthen the interface between the conductive material and the dielectric barrier layer, thus improving EM reliability.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
   placing a substrate into a processing chamber, wherein the substrate comprises a conductive contact disposed within a dielectric layer, wherein the conductive contact is separated from the dielectric layer by a barrier layer, wherein the conductive contact comprises copper;
   depositing a cobalt layer over the conductive contact, wherein the cobalt layer is in contact with the conductive contact;
   flowing a silicon based compound over the cobalt layer to form a cobalt silicide layer, wherein the cobalt silicide layer is in contact with the cobalt layer; and
   depositing a dielectric barrier layer over the cobalt silicide layer.

2. The method of claim 1, wherein the depositing the cobalt layer comprises exposing the substrate to a cobalt precursor gas to selectively forming the cobalt layer over the conductive contact while leaving exposed the dielectric surface.

3. The method of claim 2, wherein the cobalt precursor gas comprises a cobalt precursor which has the general chemical formula $(CO)_x Co_y L_z$, wherein:
   X is 1, 2, 3, 4, 5, 6, 7, 8, 9, 10, 11, or 12;
   Y is 1, 2, 3, 4, or 5;
   Z is 1, 2, 3, 4, 5, 6, 7, or 8; and
   L is a ligand independently selected from the group consisting of cyclopentadienyl, alkylcyclopentadienyl, methylcyclopentadienyl, pentamethylcyclopentadienyl, pentadienyl, alkylpentadienyl, cyclobutadienyl, butadienyl, allyl, ethylene, propylene, alkenes, dialkenes, alkynes, nitrosyl, ammonia, derivatives thereof, and combinations thereof.

4. The method of claim 1, wherein the silicon based compound is selected from the group comprising silane ($SiH_4$), disilane ($Si_2H_6$), trisilane ($Si_3H_8$), trisilylamine (TSA), derivatives thereof, and combinations thereof.

5. The method of claim 1, wherein the dielectric barrier layer comprises silicon carbide, silicon nitride, silicon oxide, silicon oxynitride, silicon carbide oxide or carbon doped silicon oxide material, derivatives thereof, or combinations thereof.

6. A method for processing a substrate, comprising:
   providing a substrate comprising a copper surface and a dielectric surface;
   depositing a cobalt layer over the copper surface;
   flowing trisilyamine (TSA) over the cobalt layer to form a cobalt silicide; and
   depositing a silicon carbon nitride (SiCN) layer over the cobalt silicide layer.

7. The method of claim 6, wherein the depositing the cobalt layer comprises exposing the substrate to a cobalt precursor gas to selectively forming the cobalt layer over the copper surface while leaving exposed the dielectric surface.

8. The method of claim 7, wherein the cobalt precursor gas comprises a cobalt precursor which has the general chemical formula $(CO)_x Co_y L_z$, wherein:
   X is 1, 2, 3, 4, 5, 6, 7, 8, 9, 10, 11, or 12;
   Y is 1, 2, 3, 4, or 5;
   Z is 1, 2, 3, 4, 5, 6, 7, or 8; and
   L is a ligand independently selected from the group consisting of cyclopentadienyl, alkylcyclopentadienyl, methylcyclopentadienyl, pentamethylcyclopentadienyl, pentadienyl, alkylpentadienyl, cyclobutadienyl, butadienyl, allyl, ethylene, propylene, alkenes, dialkenes, alkynes, nitrosyl, ammonia, derivatives thereof, and combinations thereof.

* * * * *

UNITED STATES PATENT AND TRADEMARK OFFICE
CERTIFICATE OF CORRECTION

PATENT NO. : 9,633,861 B2  
APPLICATION NO. : 14/180054  
DATED : April 25, 2017  
INVENTOR(S) : Weifeng Ye et al.

Page 1 of 1

It is certified that error appears in the above-identified patent and that said Letters Patent is hereby corrected as shown below:

In the Drawings

On sheet 1 of 3, in Figure 1, reference numeral 110, Line 1, delete "SUBSTTRATE" and insert -- SUBSTRATE --, therefor.

In the Specification

In Column 1, Line 16, delete "electronmigration" and insert -- electromigration --, therefor.

In Column 2, Line 21, delete "trisilyamine" and insert -- trisilylamine --, therefor.

In Column 4, Lines 42-43, delete "bytylacetylene," and insert -- butylacetylene, --, therefor.

In Column 4, Line 48, delete "bytylacetylene" and insert -- butylacetylene --, therefor.

In Column 4, Line 49, delete "methylbytylacetylene," and insert -- methylbutylacetylene, --, therefor.

In the Claims

In Column 10, Line 24, in Claim 6, delete "trisilyamine" and insert -- trisilylamine --, therefor.

Signed and Sealed this  
Sixth Day of June, 2017

Michelle K. Lee  
*Director of the United States Patent and Trademark Office*